United States Patent
Ausserlechner et al.

(10) Patent No.: US 11,079,446 B2
(45) Date of Patent: Aug. 3, 2021

(54) COMPACT SENSOR PACKAGE

(71) Applicant: Infineon Technologies AG, Neubiberg (DE)

(72) Inventors: Udo Ausserlechner, Villach (AT); Michael Holliber, Keutschach (AT)

(73) Assignee: Infineon Technologies AG, Neubiberg (DE)

( * ) Notice: Subject to any disclaimer, the term of this patent is extended or adjusted under 35 U.S.C. 154(b) by 349 days.

(21) Appl. No.: 15/497,296

(22) Filed: Apr. 26, 2017

(65) Prior Publication Data

US 2017/0314969 A1   Nov. 2, 2017

(30) Foreign Application Priority Data

Apr. 27, 2016  (DE) .................... 10 2016 107 798.4

(51) Int. Cl.
| | |
|---|---|
| *G01R 33/00* | (2006.01) |
| *G01R 15/20* | (2006.01) |
| *G01R 19/00* | (2006.01) |
| *G01D 5/14* | (2006.01) |

(52) U.S. Cl.
CPC ......... *G01R 33/0052* (2013.01); *G01D 5/147* (2013.01); *G01R 15/20* (2013.01); *G01R 19/0092* (2013.01)

(58) Field of Classification Search
CPC ........ G01D 5/145; G01D 5/147; G01R 33/07; G01R 33/02; G01R 33/0052; G01R 15/20; G01R 19/0092; G01B 7/30; G01B 7/003; G01P 3/487
See application file for complete search history.

(56) References Cited

U.S. PATENT DOCUMENTS

| | | | | |
|---|---|---|---|---|
| 5,831,596 | A * | 11/1998 | Marshall ................ | G01D 5/145 345/161 |
| 2004/0085062 | A1 | 5/2004 | Miyata et al. | |
| 2004/0160220 | A1* | 8/2004 | Wendt .................... | G01D 5/145 324/207.21 |
| 2007/0229067 | A1* | 10/2007 | Sasaki ................... | B82Y 25/00 324/252 |
| 2007/0252591 | A1 | 11/2007 | Babin | |
| 2012/0105057 | A1* | 5/2012 | Mol ....................... | G01D 5/145 324/251 |
| 2013/0021025 | A1* | 1/2013 | Krishnaiah ........... | G01D 5/145 324/207.25 |
| 2013/0305843 | A1* | 11/2013 | Lee ........................ | G01L 3/104 73/862.325 |

(Continued)

FOREIGN PATENT DOCUMENTS

| | | |
|---|---|---|
| CN | 104296650 A | 1/2015 |
| DE | 102008012665 A1 | 11/2011 |

(Continued)

*Primary Examiner* — Tung X Nguyen
*Assistant Examiner* — Feba Pothen

(57) ABSTRACT

Magnetic sensor arrangement comprising a component board delimited by two opposing main surfaces and having an accommodation hole for accommodating at least part of a magnetic field generating structure, and a magnetic sensor package located at least partially between the two opposing main surfaces and configured for sensing a magnetic field generated by the magnetic field generating structure.

1 Claim, 7 Drawing Sheets

(56) References Cited

U.S. PATENT DOCUMENTS

| | | | |
|---|---|---|---|
| 2014/0070801 A1* | 3/2014 | Tamura | G01R 15/20 |
| | | | 324/244 |
| 2014/0253109 A1* | 9/2014 | Singh | G01R 15/20 |
| | | | 324/227 |
| 2015/0022192 A1* | 1/2015 | Ausserlechner | G01D 5/147 |
| | | | 324/207.25 |
| 2015/0123650 A1 | 5/2015 | Matsue et al. | |
| 2015/0300898 A1 | 10/2015 | Lee et al. | |
| 2015/0369679 A1 | 12/2015 | Ishimoto | |

FOREIGN PATENT DOCUMENTS

| | | |
|---|---|---|
| DE | 102011001194 A1 | 11/2011 |
| DE | 102014110019 A1 | 6/2015 |
| JP | H01129678 U | 9/1989 |
| JP | 2006258592 A | 9/2006 |

\* cited by examiner

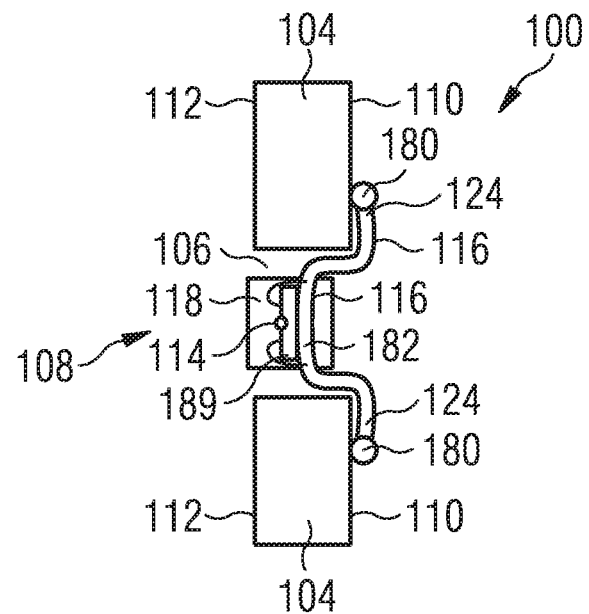
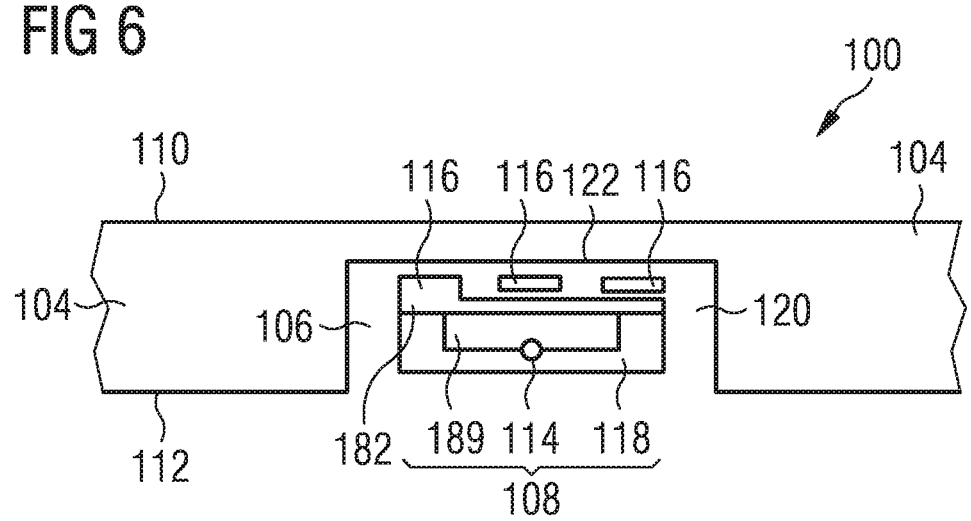

COMPACT SENSOR PACKAGE

BACKGROUND OF THE INVENTION

Field of the Invention

The present invention relates to magnetic sensor arrangements, and to methods of manufacturing a magnetic sensor arrangement.

Description of the Related Art

Conventional magnetic sensor arrangements comprise two magnetic parts mounted on a shaft and spaced apart along a rotation axis of the shaft. A magnetic field sensor element may be placed in between both parts. Such types of magnetic parts are useful to generate magnetic fields with high symmetry. The mentioned arrangement may be operated as angle sensor. A proper angle accuracy may be obtained in spite of assembly tolerances of all components.

However, there is still room to further increase accuracy of such and other types of sensors.

SUMMARY OF THE INVENTION

There may be a need for a magnetic sensor arrangement with a high sensing accuracy.

According to an exemplary embodiment, a magnetic sensor arrangement is provided which comprises a component board delimited by two opposing main surfaces and having an accommodation hole (wherein the hole may for instance be a through hole, an aperture, or a recess of the component board) for accommodating at least part of a magnetic field generating structure, and a magnetic sensor package located at least partially between the two opposing main surfaces and configured for sensing a magnetic field generated by the magnetic field generating structure.

According to another exemplary embodiment, a magnetic sensor arrangement is provided which comprises a component board having an accommodation hole (wherein the hole may for instance be a through hole, an aperture, or a recess of the component board) for accommodating at least part of a magnetic field generating structure, and a magnetic sensor package mounted on and/or in the component board and configured for sensing a magnetic field generated by the magnetic field generating structure, wherein the magnetic sensor package comprises a sensing element on a carrier, and wherein the sensing element extends from the carrier towards the component board.

According to yet another exemplary embodiment, a method of manufacturing a magnetic sensor arrangement is provided, wherein the method comprises providing a component board delimited by two opposing main surfaces with an accommodation hole for accommodating at least part of a magnetic field generating structure, and arranging a magnetic sensor package at least partially between the two opposing main surfaces and configured for sensing a magnetic field generated by the magnetic field generating structure.

According to still another exemplary embodiment, a method of manufacturing a magnetic sensor arrangement is provided, wherein the method comprises providing a component board with an accommodation hole for accommodating at least part of a magnetic field generating structure, mounting a magnetic sensor package on and/or in the component board, configuring the magnetic sensor package for sensing a magnetic field generated by the magnetic field generating structure, equipping the magnetic sensor package with a sensing element on a carrier, and arranging the sensing element on the carrier to extend from the carrier towards the component board.

According to still another exemplary embodiment, a magnetic sensor arrangement is provided which comprises a component board having a first vertical thickness and having an accommodation hole for accommodating at least part of a magnetic field generating structure, and a magnetic sensor package or a bare semiconductor chip having a second vertical thickness, mounted on the component board, and comprising a sensing element configured for sensing a magnetic field generated by the magnetic field generating structure, wherein the sensing element is located vertically not more than one third of the sum of the first vertical thickness and the second vertical thickness away from a vertical center vertically in the middle between an upper end and a lower end of an assembly composed of the component board and the magnetic sensor package or the bare semiconductor chip mounted thereon.

According to an exemplary embodiment of the invention, a highly compact magnetic sensor arrangement is provided with a small extension of a sensing portion in a vertical direction.

According to one aspect, this can be accomplished by locating a magnetic sensor package partially or entirely within a component board rather than fully outside of the component board or completely surface mounted thereon. In other words, it is possible to countersink at least part of the magnetic sensor package in the component board to thereby obtain a compact configuration while arranging a sensing element close to an axial center position. When at least part of the magnetic sensor package, in particular at least a sensing element thereof, at least partially extends into the component board, the sensing portion adds a net vertical extension to the entire thickness of the arrangement which is less than the magnetic sensor package thickness. In the example of an angle sensor using one or more magnetic elements with asymmetric magnetic properties on a rotating shaft, this reduces the distance between the sensing element of the magnetic sensor package and the one or more magnetic elements, therefore increasing the accuracy of the magnetic sensing as a consequence of the smaller distance between sensing element and magnetic element(s) and hence increased magnetic field sensed by the sensing element. Moreover, a reduced vertical thickness of the sensor arrangement and hence a higher compactness may be achieved.

In another aspect, which can be combined with the previously described aspect or which can be realized alternatively, it is possible that the internal construction of the magnetic sensor package is configured so that a low vertical thickness of the sensor portion of the magnetic sensor arrangement can be achieved. In particular, this may be accomplished by mounting a sensing element of the magnetic sensor package on a carrier thereof and orienting the sensing element so that it faces the component board rather than being directed away from the component board. Also this keeps an axial dimension of the sensing portion of the magnetic sensor arrangement small since excessive protrusions of the sensing element in a vertical direction can be avoided. Hence, also the other aspect contributes to an increase of the precision of the magnetic sensing and to a smaller design. Consequently, a compact magnetic sensor arrangement can be obtained which simultaneously has a high measurement accuracy.

DESCRIPTION OF FURTHER EXEMPLARY EMBODIMENTS

In the following, further exemplary embodiments of the magnetic sensor arrangements and the methods will be explained.

In an embodiment, the magnetic sensor package (in particular a sensing element thereof) is at least partially located within the accommodation hole. Thereby, a particular compact arrangement may be obtained which also allows the magnetic sensor package and in particular a sensing element thereof to be located very close to an axial center of the magnetic field generating structure which may correspond to a center plane of the component board. This results in a particularly high detection accuracy.

In an embodiment, the magnetic sensor package is mounted at one of the main surfaces of the component board and extends into the accommodation hole. In this configuration, the magnetic sensor package is provided with a stable mounting base and can nevertheless be configured with a small vertical thickness in combination with the component board.

In an embodiment, the magnetic sensor package comprises a sensing element (in particular a semiconductor chip or part thereof) on a carrier, wherein at least one of the sensing element and the carrier is at least partially encapsulated by an encapsulant.

The encapsulant may be a mold compound or a laminate.

The term "sensing element" may particularly denote a physical structure which has at least one measurable property being characteristically influenced by the magnetic field at the position of the sensing element. Examples for such a sensing element are a Hall sensor (in particular a Hall plate, or a vertical Hall effect device) or a magnetoresistive sensor (in particular an Anisotropic Magneto-Resistive (AMR), Giant Magneto-Resistive (GMR) or Tunnel Magneto-Resistive (TMR) sensor). A Hall sensor may detect the magnetic field based on a Hall effect. A magnetoresistive sensor may detect the magnetic field based on the phenomenon of the change of the electric resistance of a sensor material depending on the magnetic field. It is also possible to provide the sensing element as an arrangement of two or more of the above mentioned or other sensor types. For example, multiple magnetoresistive sensors may be arranged in a Wheatstone bridge.

The carrier may be a chip carrier such as a leadframe, interposer, substrate, etc.

In an embodiment, at least part of the sensing element and at least part of the encapsulant are located in the accommodation hole or may be embedded in the component board. In particular, the carrier may be a flat structure in one embodiment. The sensing element plus encapsulant may be a bulky structure with terminals extending from one main surface of the carrier. In a preferred embodiment, such a protruding sensing element-encapsulant assembly may be located at least partially in the accommodation hole to obtain a compact and highly accurate magnetic sensor arrangement.

In an embodiment, at least part of the carrier is mounted at one of the main surfaces of the component board. When being mounted on a main surface of the component board, the carrier may be directly electrically coupled with electrically conductive traces on this surface of the component board, which not only accomplishes a mechanical connection but also an electrical connection.

In an embodiment, the carrier is essentially flat and is entirely located outside of the accommodation hole (compare for example FIG. 1). In the context of this application, the term "essentially flat" may particularly denote that slight deviations from a completely flat geometry are still covered. In particular, a stamping of the carrier (in particular a lead frame), a half etching of the carrier or a profile in the carrier of less than twice of the thickness of the carrier may still be considered as an essentially flat carrier. Still referring to the described embodiment and FIG. 1 for the purpose of explanation, a carrier can be considered to be "entirely located outside of the accommodation hole" when it is located outside of the two opposing main surfaces of the component board in an axial direction, even if it is partly located inside the radial range of the accommodation hole.

In such an embodiment, the plate or sheet type carrier serves as a cantilever contributing substantially nothing to the vertical thickness of the magnetic sensor arrangement. At least a major portion of the sensing element in the encapsulant however extends from this plate or sheet-like carrier into the accommodation hole and may therefore assume a position close to a vertical and axial center of the magnetic field generating structure. This has a positive impact on detection accuracy and compactness.

In an embodiment, at least a portion of, in particular a terminal portion of, the carrier is curved or bent and is located partially inside and partially outside of the accommodation hole. In such an embodiment, a concave portion of the three-dimensionally curved carrier may be used for accommodating the sensing element and the encapsulant in a space-saving manner. Again, this package architecture is highly compatible with a high precision of the detection of the magnetic field and adds only a small amount to the volume of the magnetic sensor arrangement.

In an embodiment, the magnetic sensor package is mounted in a cavity at a third surface of the component board between the opposing main surfaces of the component board. By embedding the magnetic sensor package at least partially in a cavity of the component board, i.e. in a blind hole thereof, an also highly compact magnetic sensor arrangement with simple design can be obtained.

In an embodiment, the sensing element is arranged between the carrier and the component board (in contrast to another design in which the carrier is located between the sensing element and the component board). Between the carrier and the component board, the tiny sensing element together with at least a major portion of its encapsulant is mechanically safely protected and is arranged so that its contribution to the vertical thickness of the magnetic sensor arrangement is very small.

In an embodiment, the carrier is curved to thereby form a cavity in which the sensing element is at least partially accommodated. Arranging the sensing element and the encapsulant in a concave portion of a three-dimensionally curved carrier (such as a bent leadframe) rather than further protruding from a convex portion of the carrier allows to realize the magnetic sensor arrangement with small space consumption and with high sensing accuracy.

In an embodiment, the magnetic sensor package comprises an encapsulant, wherein at least one of the sensing element and the carrier is at least partially encapsulated by the encapsulant. Such an encapsulant provides mechanical protection and electrical isolation of the sensing element while allowing the magnetic field to penetrate into the magnetic sensor package. This can be accomplished by a mold-type encapsulant or by a laminate-type encapsulant.

In an embodiment, the encapsulant is arranged at least partially between the carrier and the component board.

Hence, also the quite bulky encapsulant may be located facing towards the component board, thereby further increasing compactness.

In an embodiment, the carrier is mounted on one of two opposing main surfaces of the component board. This geometry allows to bring the sensing element close to a radial and axial center of the magnetic field generating structure.

In an embodiment, the sensing element is located inside the magnetic sensor package so as to be located closer to a mounting surface of the magnetic sensor package than to another magnetic sensor package surface opposing the mounting surface.

In an embodiment, the magnetic sensor package is located within or next to a symmetry plane of the magnetic field generating structure (which may correspond to a symmetry plane of the component board). For instance, a magnetic field generating structure may be a rotatable shaft with two axially symmetrically spaced magnetic elements with radially asymmetric properties. Arranging the sensing element in the symmetry plane between two such axially spaced magnetic elements allows to obtain an extraordinarily high accuracy of the detection of an angular position or the like.

In an embodiment, the magnetic sensor package is mounted on the component board so that an axial spacing between the sensing element and a nearest rotatable portion of the magnetic field generating structure is larger than an axial spacing between the carrier and the nearest rotatable portion. This configuration results in a very high measurement accuracy.

In an embodiment, the magnetic sensor package is a leaded sensor package. Such an embodiment is shown in FIG. 1 and FIG. 2. In another embodiment, the magnetic sensor package is a Surface Mounted Device (SMD) sensor package. Such an embodiment is shown in FIG. 3 to FIG. 5. In yet another embodiment, the magnetic sensor package is a leadless sensor package. Such an embodiment is shown in FIG. 6. Hence, the architecture of exemplary embodiments is compatible with very different types of packages.

In an embodiment, at least one of at least one terminal (which may form an end portion of a carrier such as a leadframe) extends out of the magnetic sensor package and extends along one of the main surfaces. This results in a vertically compact configuration.

In an embodiment, all of a plurality of terminals extend out of the same side edge of the magnetic sensor package (see for instance FIG. 2). Such a configuration, which may correspond to a leaded sensor package design allows to transport signals between magnetic sensor package and electronic periphery in a compact way.

In an embodiment, a plurality of terminals extend out of at least two, in particular at least two opposing, side edges of the magnetic sensor package (see for instance FIG. 3). Such a design of terminals allows to transport a large number of signals between magnetic sensor package and electronic periphery.

In an embodiment, the magnetic sensor arrangement comprises at least one further magnetic sensor package located at least partially between the two opposing main surfaces and configured for sensing a magnetic field generated by the magnetic field generating structure, wherein the magnetic sensor packages are configured for sensing a magnetic field at different circumferential positions around the magnetic field generating structure. Thus, the described architecture is compatible with the arrangement of multiple circumferentially distributed magnetic sensor packages each of which being capable of detecting a local magnetic field. Hence, the accuracy of detecting information indicative of an angular position of a rotatable magnetic field generating source or a current flowing through a conductor type magnetic field generating source can be obtained without adding anything to the vertical thickness of the magnetic sensor arrangement.

In an embodiment, the magnetic sensor arrangement comprises the magnetic field generating structure which may be arranged at least partially within the accommodation hole. For example, such a magnetic field generating structure may comprise a permanent magnet or an electromagnet. It is also possible that the magnetic field generating structure is a conductor through which a high electrical current flows. In the latter configuration, the magnetic field to be detected is generated due to the fact that a magnetic field develops around a conductor through which an electrical current flows.

In an embodiment, the magnetic field generating structure comprises a rotatable shaft, being rotatable relative to the magnetic sensor package, and comprises at least one magnetic element mounted on the shaft and having asymmetric magnetic properties with regard to a rotation angle, which is to be sensed, of the shaft. For instance, the shaft may have non-magnetic properties or may have magnetic properties (for instance may be of ferrous material or magnetic steel). However, the preferably two axially spaced magnetic elements on this shaft preferably have an angularly asymmetric configuration (for instance obtained by an angularly varying thickness of the magnetic elements). The magnetic field detected by a sensing element in a magnetic sensor package of the magnetic sensor arrangement may precisely depend on the present angular position of the magnetic elements. Thus, such a configuration may be used as an angular sensor.

In another embodiment, the magnetic field generating structure comprises an electrically conductive structure through which an electric current, which is to be sensed, can flow. In such a configuration, the magnetic sensor arrangement may be configured as a current detector, since the magnetic field detected by the sensing element depends characteristically on the value of the current flowing through the electric conductor.

In an embodiment, the accommodation hole is one of the group consisting of a blind hole, a groove, a board internal through hole, and a recess at an edge of the board. Other configurations are possible as well.

In an embodiment, the component board is a printed circuit board (PCB). Such a PCB may serve not only as a stable mounting base but can also provide the desired electric circuitry. Other plate shaped component boards are possible as well.

In an embodiment, the magnetic sensor arrangement is configured as one of the group consisting of an angle sensor and a current sensor. Other sensor applications are however possible as well.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 5 illustrates a cross-sectional view of the magnetic sensor arrangement of FIG. 3 along a line A-A'.

FIG. 6 illustrates a cross-sectional view of part of a magnetic sensor arrangement configured as angle sensor according to still another exemplary embodiment.

DETAILED DESCRIPTION OF EXEMPLARY EMBODIMENTS

Figure 1:
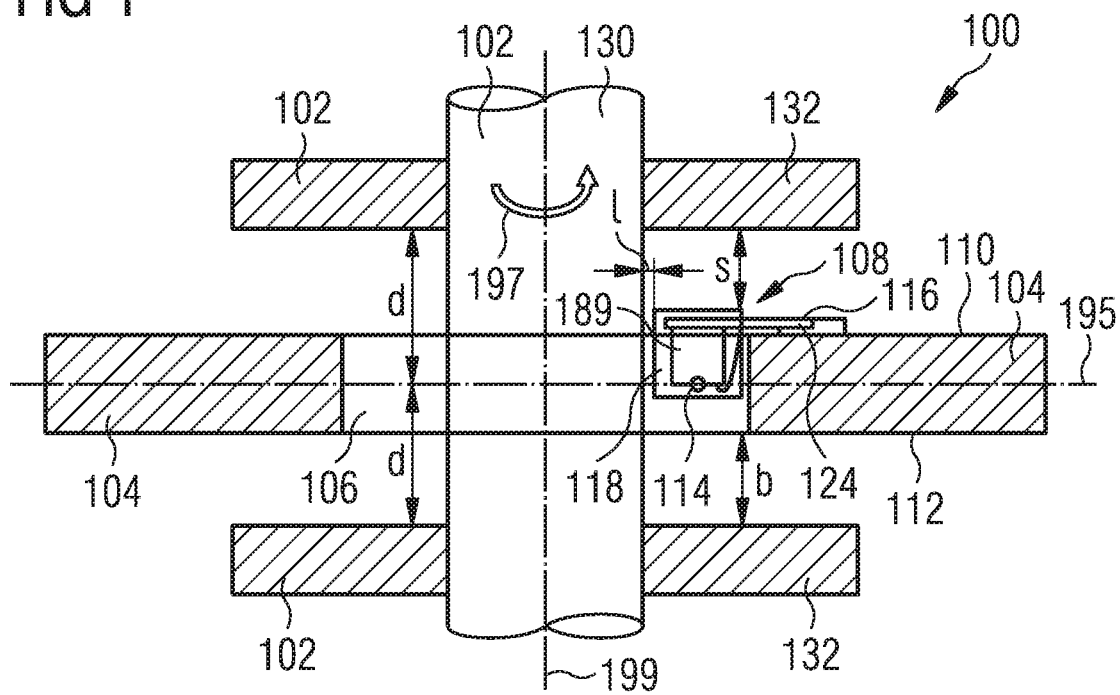
FIG. 1 illustrates a cross-section of a magnetic sensor arrangement configured as angle sensor according to an exemplary embodiment.

The illustration in the drawing is schematically and not to scale.

Before exemplary embodiments will be described in more detail referring to the figures, some general considerations will be summarized based on which exemplary embodiments have been developed.

It would be advantageous if one or more sensing elements of a magnetic sensor package could be placed in a symmetry plane (z=0) between two magnetic elements of a magnetic field generating structure or at least close to the symmetry plane. On the other hand, the spacing of magnetic elements of a magnetic field generating structure should be close in order to increase the magnetic field in between them and to decrease the magnetic field far off the magnets (which may otherwise disturb nearby other equipment).

Magnetic sensing elements may be housed in a magnetic sensor package, which may be mounted to a component board (for example a printed circuit board, PCB). The component board may have an accommodation hole to accommodate a shaft of the magnetic field generating structure. It is for instance also possible that the component board has the shape of a fork to define the accommodation hole. Moreover, the component board may be placed between two magnetic elements, so the spacing of the magnetic elements should be large enough to accommodate the component board and the sensor package(s). If the component board is for example 1 mm thick and the magnetic sensor package is 1 mm thick, this means 2 mm plus some clearance of 1 mm above and below, which gives a minimum spacing between the magnets of around 4 mm.

Exemplary embodiments of the invention may consider one or more of the above and other boundary conditions to provide a magnetic sensor arrangement with high detection accuracy.

A first aspect of an exemplary embodiment of the invention allows to reduce the axial space consumption of the magnetic sensor arrangement or assembly. This may involve a specific design of an off-axis/through-shaft magnetic angle sensor, where the sensing elements are placed around a rotatable shaft. Advantageously, it is possible to mount a magnetic sensor package up-side down onto the component board, so that the magnetic field sensing element is located below the top surface of the component board, to which the magnetic sensor package is attached. In this context, it is possible to provide a through-shaft to which two magnetic elements are mounted and a component board is placed between both magnetic elements (compare for example FIG. 1). The shaft and the magnetic elements may be rotatable as a whole, whereas the component board may be stationary. At least one magnetic sensor package may be mounted to the component board (for example, it is possible to mount three magnetic sensor packages at integer multiples of 120° on the same radius, which is concentric to the rotation axis). The component board may be configured with a shape of a fork so that it is possible to insert it between the magnetic elements without taking a magnetic element off the shaft. However, it is also possible for the component board to have only an interior accommodation hole which accommodates the shaft.

Generally, there are radial and axial clearances between stationary parts and rotatable parts of the described magnetic sensor arrangement. In view of this consideration, a task may be to arrange one or more magnetic sensor packages and the component board such that the clearances are of sufficient dimension, when the spacing of the two magnet elements has a certain predetermined value. A small spacing may be beneficial for large signals and small space consumption. In many cases, the diameter of the magnetic elements scales with the spacing between them: smaller diameters correspond to a smaller axial gap between them, and vice versa. Then, in particular for small diameters, it may become challenging to insert a component board plus magnetic sensor package(s) and provide enough clearance to avoid collision.

An advantage of an exemplary embodiment of the invention is that the axial position of the sensing element may be selected to be between both outer surfaces (i.e. bottom surface of component board and top surface of magnetic sensor package). In particular, the z-coordinate (i.e. the vertical coordinate in a direction perpendicular to a symmetry plane of the component board, wherein this perpendicular direction can also be denoted as an axial direction in the context of this description) of the sensing element may be lower than the top surface of the component board. This may help to place the sensor element in the symmetry-plane of the magnetic elements (which corresponds to a center plane) so that the axial clearances above and below the component board may be increased, in particular may be maximized.

The following exemplary embodiment shows how this principle may be implemented for a surface mounted device (SMD) package placed up-side down into an accommodation hole or recess in the component board (it is possible to provide a single magnetic sensor package, although several ones may be placed or distributed around the rotatable shaft). If the thickness of the component board is chosen so that the magnetic sensor package does not protrude at the bottom side of the component board or carrier this is highly advantageously, because then the component board protects the magnetic sensor package from collision with rotatable parts. In particular, a sensitive surface (for instance the lower surface of the package portion in the accommodation hole in FIG. 1) of a semiconductor chip of the magnetic sensor package may be protected against such collisions, whereas a less sensitive counter surface (for instance the upper surface of the package portion outside the accommodation hole in FIG. 1) of the magnetic sensor package at which the robust carrier is located can be exposed closer to rotatable parts. The sensitive surface may include bond wires and a silicon surface including a sensing element. The less sensitive surface may include a lead frame backside of the carrier.

It is to be understood that embodiments of the invention work also for leadless packages, for instance when the component board has no through-hole, but in contrast to this a recess forming a cavity (compare for instance FIG. 6).

It should further be mentioned that embodiments of the invention may work regardless of the orientation of a semiconductor chip (i.e. regardless of a face-up geometry, a face-down geometry, a flip-chip geometry, etc.).

Exemplary embodiments of the invention may also be implemented for magnetic current sensors (so that applications of embodiments of the invention are not limited to angle sensors). In such a scenario, the shaft carrying the magnetic element(s) may be replaced by a thick conductor and the magnetic field sensor(s) on the component board may detect the magnetic field generated by an electric current flowing through the conductor. Hence, it may be possible to derive an estimated current therefrom. However, exemplary embodiments of the invention are particularly useful for off-axis/through-shaft magnetic angle sensors with two magnets having a narrow gap in-between.

According to an exemplary embodiment, a magnetic sensor arrangement is provided which comprises a component board comprising two main surfaces, preferably perpendicular to a vertical axis (i.e. top and bottom surfaces). The component board may comprise an accommodation hole (such as an aperture or a recess). At least one magnetic field sensing element may be located in and/or on a die, wherein the die may be housed in a magnetic sensor package comprising electric terminals. The magnetic sensor package may be mounted to the component board near the accommodation hole in such a way that the electric terminals of the magnetic sensor package are closer to the first of the two main surfaces than to the second of the two main surfaces, such that the spacing between the at least one magnetic field sensing element and the second of the two main surfaces is smaller than the axial spacing between the electric terminals and the second of the two main surfaces.

The described arrangement may be configured as a magnetic current sensor, in which a conductor is passed through the accommodation hole in the component board.

In an exemplary embodiment, the die which may form the sensing element, may protrude into the accommodation hole in a plan view along the vertical axis.

In one embodiment, the sensor package is a leadless package. At least one of the terminals may protrude laterally (i.e. in xy-plane) out of the magnetic sensor package.

In another embodiment, all terminals may protrude laterally out of the same surface of the magnetic sensor package (which may correspond to a leaded package architecture).

It is also possible that all terminals protrude laterally out of two opposite surfaces of the sensor package (which may correspond to an SMD package).

According to an embodiment, the accommodation hole may be configured to accommodate a shaft which is rotatable around a z-axis or a conductor that passes through the accommodation hole.

A magnetic field source or magnetic field generating structure may be attached to the shaft or may form an integral part thereof.

It is possible that the die is attached to a die-paddle of a leadframe and connected to electrical terminals made from the leadframe. A die-paddle may be a part of a lead frame. A singularized die or chip may be solderable or glueable on such a die-paddle.

A second aspect of an exemplary embodiment of the invention (which may be combined with the first aspect) also allows to reduce the axial space consumption of the magnetic sensor assembly. In such an embodiment, an off-axis/through-shaft magnetic angle sensor may be provided in which the sensor elements may be placed around a rotatable shaft.

Conventionally, an SMD package may be mounted on the component board, wherein the sensor die may be located at this side of the magnetic sensor package, which is opposite to the leads, which are soldered to the component board (such as a PCB). Since the thickness of the magnetic sensor package is roughly equal to the thickness of the component board, the axial position of the magnetic field sensing element(s) is shifted upwards, away from the symmetry center, such that an axial distance z in FIG. 8 may be much smaller than an axial distance y. If it is desired to place them in the symmetry center, it would be required to pull the magnetic elements further apart, and then the clearance between the component board and the lower magnetic element would be smaller than the clearance between the magnetic sensor package and the upper magnetic element, which is a waste in construction space. Moreover, if the shaft has an axial play, there is conventionally a certain risk that the magnetic element collides with the fragile top surface of the magnetic sensor package. This may cause the magnetic sensor arrangement to malfunction.

An exemplary embodiment of the invention may place a sensor chip of the magnetic sensor package below the chip carrier (such as a leadframe) so that the sensing element(s) is/are oriented towards the same side as the solderable contact portions of the leads or terminals. The package may be mounted to the component board. So the sensing element(s) may be roughly mid-way in a sandwich structure comprising the component board and the magnetic sensor package, such that an axial distance x (for example a distance between sensing element and magnet) above and below the magnetic field sensing element(s) is identical or at least similar (for instance up to 33%). More generally, a distance between sensing element and top side of the package may be the same or may be approximately the same as a distance between the sensing element and the bottom side of the component board. Since component board and magnetic sensor package may be roughly equally thick, it is possible to place the sensing element(s) in the center plane (z=0) or close to the center plane and still benefit of equal clearances between component board and lower magnetic element, and sensor and upper magnetic element. If (for example due to axial play of the shaft) a magnetic element collides with the magnetic sensor package, the fragile semiconductor chip and its bond wires (which may be located on the chip surface which contains the magnetic field sensor elements) may be protected from the rotating parts, because they are in between the sandwich of the component board and the magnetic sensor package.

In some embodiments, there is only a single magnet portion, and instead of the second magnet portion there may be some ferrous part attached to the shaft like for example a disk, which acts as a magnetic shield to shield off external magnetic disturbances (coming from the mains supply or other nearby equipment) from the magnetic sensor elements.

An advantage of protecting the fragile sensing element(s) from rotating parts also holds if there is only a single magnet portion without second magnet portion and without second ferrous shield. It is also possible to place the single rotating magnet portion below the component board in order to protect the magnetic sensor package from the rotating magnetic element.

An advantage of exemplary embodiments of the invention may be more significant for small magnetic elements with for example outer diameters of roughly 25 mm, because then it may be desired to have small axial spacings between magnetic element(s) and sensing element(s) in the order of roughly 2 mm.

In an embodiment, the magnetic sensor package may have leads/pins on all four sides along its perimeter, or it may be a dual in-line type of magnetic sensor package which has leads/pins only on two opposite sides along its perimeter. Further alternatively, the magnetic sensor package may be a leaded type of package that has leads only on a single side along its perimeter. It may also be a leadless package that has solder pads on its mounting surface. These pads may populate the entire mounting surface or just a portion of the perimeter of the mounting surface. In particular it may have pads only on one, two or three sides of the perimeter. In all these cases, it may be beneficial if there are no lead/pins/pads near at least one side of the magnetic sensor package, namely this side which is closest to the rotating shaft. This increases or even maximizes the clearance between the rotating shaft and the magnetic sensor package, even although a certain radial distance of the sensor element(s) may be advantageous to obtain proper performance (by placing the magnetic elements at a radial position where the magnetic field is strong enough to be detected with high accuracy and still symmetric enough to keep errors due to mounting tolerances small).

In an exemplary embodiment, an angle sensor arrangement is provided which comprises a shaft rotatable around a rotation axis, and a component board with an accommodation hole (such as an aperture or any other type of hole accommodating the shaft). A magnetic field source may be attached to the shaft. At least one magnetic field sensing element may be located in and/or on a substrate housed in at least one magnetic sensor package mounted to the component board. An axial spacing may be provided between the at least one magnetic field sensor element and the magnetic field source, wherein the magnetic field sensor element may be placed inside the magnetic sensor package so that it is closer to the mounting surface of the magnetic sensor package than to a second package surface, which is opposite the mounting surface of the package.

According to an embodiment, the at least one magnetic sensor package may be located in a symmetry-plane of the magnetic field source, which may be perpendicular to the rotation axis.

In an embodiment, the substrate may be a silicon die.

It is possible that the magnetic sensor arrangement comprises at least one magnetic field sensing element and circuitry to read out its output signal (for instance in terms of signal conditioning).

In an embodiment, the at least one magnetic sensor package may comprise a leadframe, to which the sensor substrate may be mounted. The magnetic sensor package may be mounted on the component board so that the axial spacing between substrate and nearest rotatable part is larger than an axial spacing between leadframe and said nearest rotatable part.

Figure 2:
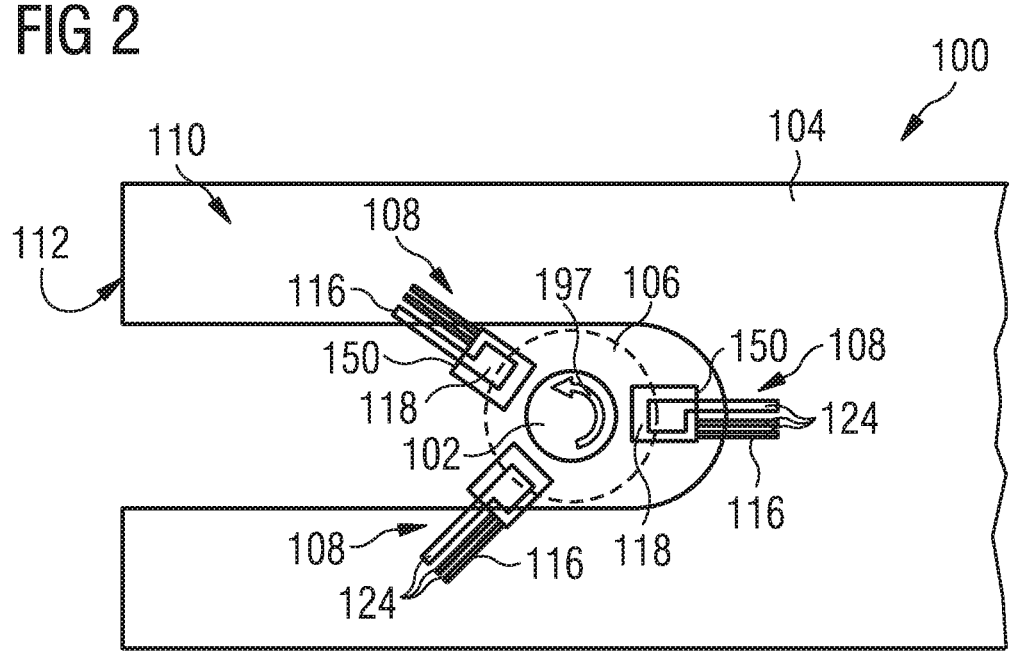
FIG. 2 illustrates another view of the magnetic sensor arrangement according to FIG. 1.

FIG. 1 illustrates a cross-section of a magnetic sensor arrangement 100 configured as angle sensor according to an exemplary embodiment. FIG. 2 illustrates another view of the magnetic sensor arrangement 100 according to FIG. 1.

The magnetic sensor arrangement 100 comprises a plate-shaped component board 104, which is here embodied as a printed circuit board (PCB). The component board 104 is delimited by two opposing main surfaces 110, 112 and has an accommodation hole 106, here embodied as a through hole. The component board 104 can be a laminate of electrically conductive traces in a dielectric matrix. The accommodation hole 106 accommodates a rotatable (see rotation axis 199 and rotating arrow 197) shaft 130 of a magnetic field generating structure 102. Moreover, three magnetic sensor packages 108 (compare FIG. 2) are foreseen which are located partly between the two opposing main surfaces 110, 112 and within the accommodation hole 106. Another part of the magnetic sensor packages 108 slightly protrudes beyond main surface 110 in a vertical direction. The magnetic sensor packages 108 are configured for sensing a respective local value of a magnetic field generated by the magnetic field generating structure 102, more specifically generated by two axially spaced magnetic elements 132 thereof being fixedly mounted on the shaft 130. The magnetic elements 132 are spaced vertically symmetrically with regard to an axial symmetry plane 195. The magnetic sensor packages 108 are mounted at main surface 110 and extend into the accommodation hole 106. Each of the magnetic sensor packages 108 comprises a sensing element 114 (being provided on or forming part of a semiconductor chip 189) mounted on an electrically conductive carrier 116. Both the sensing element 114 (fully) and the carrier 116 (partially) are encapsulated by an encapsulant 118 which may be a dielectric mold compound. The sensing elements 114 and part of the encapsulants 118 are located in the accommodation hole 106. The carriers 116 are mounted at the main surface 110. As can be seen best in FIG. 1, the carriers 116 (i.e. the lead frames) are embodied as flat conductors and are entirely located outside of the accommodation hole 106 (wherein the accommodation hole 106 is laterally delimited by the vertical wall of the component board 104 and is vertically delimited by the vanishing lines of the upper main surface 110 and the lower main surface 112). In the shown embodiment, the magnetic sensor packages 108 are leaded sensor packages. Terminals 124 extend out of the respective magnetic sensor package 108 and extend along and parallel to main surface 110. More specifically, all terminals 124 extend out of the respectively same side edge 150 of the respective magnetic sensor package 108.

As can be taken from FIG. 1 (while reference should be made to FIG. 7 as well), the magnetic field generating structure 102 comprises the rotatable shaft 130, being rotatable relative to the component board 104 and the magnetic sensor packages 108. Furthermore, the magnetic field generating structure 102 comprises the two symmetrically positioned magnetic elements 132 which may be of a permanent magnetic material with asymmetric magnetic properties with regard to a rotation angle to be sensed. The magnetic elements 132 are disk-shaped with a thickness varying within a plane perpendicular to the shaft axis.

As can be taken from FIG. 2, altogether three magnetic sensor packages 108 are located partially between the two opposing main surfaces 110, 112 and are each configured for sensing a magnetic field generated by the magnetic field generating structure 102. The magnetic sensor packages 108 are hence configured for sensing a magnetic field at different circumferential positions around the magnetic field generating structure 102. This provides a spatial magnetic field profile and hence increases accuracy of the detection.

The elevation view of FIG. 1 shows an equal spacing d in a vertical direction between the magnetic elements 132 and a vertical position of the sensing element 114 of the respective magnetic sensor package 108. An axial distance s between an upper end of the respective magnetic sensor package 108 and a lower surface of the upper magnetic element 132 can be kept very small due to the spatial arrangement of the individual components of the magnetic sensor arrangement 100 according to FIG. 1. Also a small radial clearance 1, i.e. a radial distance between a cylindrical surface of the rotatable shaft 130 and the radially inner end of the respective magnetic sensor package 108 can be kept very small. Also an axial clearance b between an upper surface of the lower magnetic element 132 and lower main surface 112 of the component board 104 can be kept quite small, and for instance identical or very similar to the axial clearance s. Advantageously, a bulky portion of a respective magnetic sensor package 108 which extends downwardly from the exposed portion of the flat or sheet-like carrier 116 extends into the accommodation hole 106 and therefore does not contribute significantly to the vertical thickness of the sensing portion of the magnetic sensor arrangement 100 according to FIG. 1. Thus, a compact and highly symmetric arrangement may be obtained which allows to detect a magnetic field by the sensing elements 114 with high accuracy. The leaded packages constituting the magnetic sensor packages 108 according to FIG. 1 protrude into the aperture or accommodation hole 106 of the PCB-type component board 104 and are oriented face-down.

The plan view of FIG. 2 shows how the three leaded magnetic sensor packages 108 are distributed around a circumference of the cylindrical shaft 130, wherein each two neighboured magnetic sensor packages 108 are spaced with regard to one another by 120°. This allows to properly detect the magnetic profile around the shaft 130.

During operation of the magnetic sensor arrangement 100 according to FIG. 1 and FIG. 2, the shaft 130 rotates with a certain angular velocity. Due to the angularly asymmetric configuration of the magnetic elements 132 (compare FIG. 7), the sensing elements 114 detect a respective magnetic field value which is a clear fingerprint for the present angular position of the magnetic elements 132 and therefore of the shaft 130 on which the magnetic elements 132 are rigidly mounted so as to rotate together with the shaft 130. Since the position of the respective sensing element 114 is quite close to the radial center of the shaft 132 and is located symmetrically with regard to the two magnetic elements 132, a high accuracy of the detection result can be obtained.

With the arrangement according to FIG. 1 and FIG. 2, an axially central positioning of the sensing elements 114 is achieved. Such a symmetric geometry allows to keep the absolute distance between the sensing elements 114 and the magnetic elements 132 small, which results in a high detection accuracy. With this sufficiently small absolute distance, which is at the same time sufficiently large to prevent collision of the various elements of the magnetic sensor arrangement 100 during operation, also a compact design is realized. With the leaded package configuration according to FIG. 1 and FIG. 2, it is possible that terminals 124 are exposed on the one, two, three, or all four side edges of the respective magnetic sensor package 108.

Figure 3:
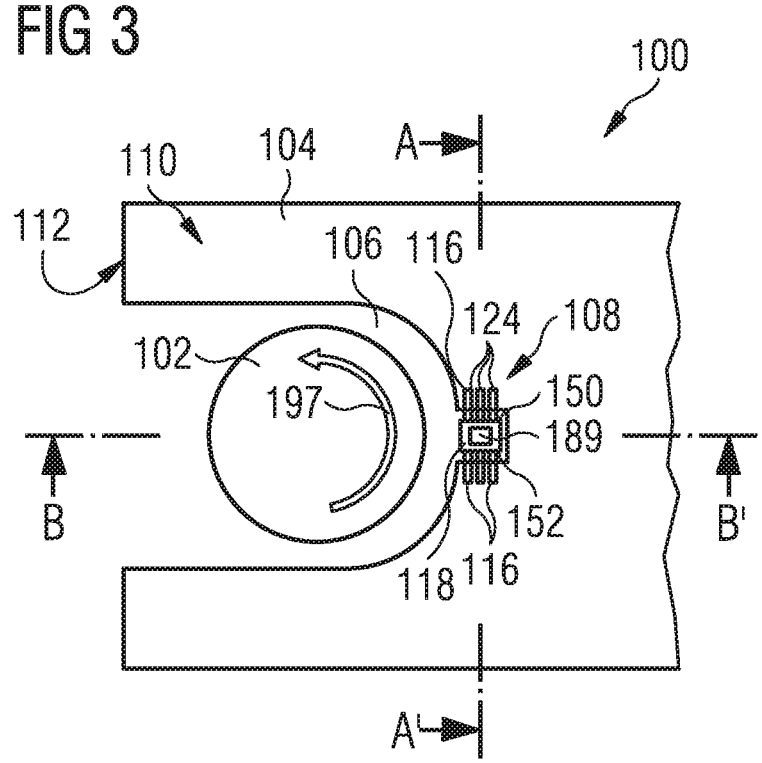
FIG. 3 illustrates a plan view of a magnetic sensor arrangement configured as angle sensor according to another exemplary embodiment.
Figure 4:
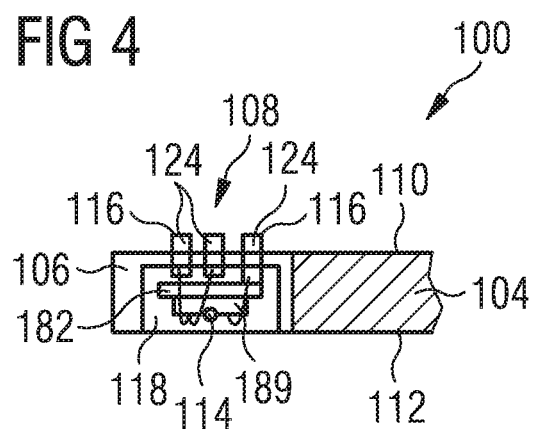
FIG. 4 illustrates a cross-sectional view of the magnetic sensor arrangement of FIG. 3 along a line B-B'.

FIG. 3 illustrates a plan view of a magnetic sensor arrangement 100 configured as angle sensor according to another exemplary embodiment. FIG. 4 illustrates a cross-sectional view of the magnetic sensor arrangement 100 of FIG. 3 along a line B-B'. FIG. 5 illustrates a cross-sectional view of the magnetic sensor arrangement 100 of FIG. 3 along a line A-A'.

In the embodiment according to FIG. 3 to FIG. 5, the magnetic sensor package 108 is a Surface Mounted Device (SMD) sensor package. In this embodiment, a plurality of terminals 124 extend out of two opposing side edges 150, 152 of the magnetic sensor package 108. As can be seen best in FIG. 5, the carrier 116 is here a curved leadframe and is located partially inside and partially outside of the accommodation hole 106.

As can be taken from FIG. 3, the accommodation hole 106 is here configured so that the component board 104 has a fork-shaped design. This simplifies insertion of the shaft 102 into the accommodation hole 106 to a desired position. As can furthermore be taken from FIG. 3, the magnetic sensor package 108 extends vertically into a narrow hole section at an innermost position of the accommodation hole 106. With this geometry, assembly or disassembly of the shaft 102 is not disturbed by the magnetic sensor package 108. As shown with reference numeral 180 in FIG. 5, end portions of the carrier 116 may be soldered to main surface 110 of the component board 104. On a die-paddle 182 of the carrier 116, the sensing element 114 on the semiconductor chip 189 is mounted. Elements 182, 114, 189 are encapsulated by encapsulant 118. Thus, a bent portion of the carrier 116 as well as the sensing element 114 and a major portion of the encapsulant 118 are located in the accommodation hole 106 and therefore do not add significantly to the thickness of the sensor portion of the magnetic sensor arrangement 100 according to FIG. 3 to FIG. 5.

With the SMD (surface mounted device) configuration according to FIG. 3 to FIG. 5, it is possible that terminals 124 of a bent lead frame are exposed on two opposing side edges 150, 152 of the magnetic sensor package 108.

FIG. 6 illustrates a cross-sectional view of a magnetic sensor arrangement 100 configured as angle sensor according to still another exemplary embodiment. In the embodiment according to FIG. 6, the magnetic sensor package 108 is mounted in a cavity 120 and on a third surface 122 located between and parallel to the opposing main surfaces 110, 112 of the component board 104. The architecture according to FIG. 6 corresponds to a leadless sensor package configuration of the magnetic sensor package 108. The carrier 116 of the lead frame type shown in FIG. 6 can be manufactured by half etching.

In the configuration according to FIG. 6, a bottom of the magnetic sensor package 108 does not or not significantly extend beyond a bottom of the component board 104. In a preferred embodiment, the thickness of the component board 104 is such that the axial position of the sensing element 114 is in the middle between top surface 110 and bottom surface 112 of the component board 104.

With the leadless package configuration according to FIG. 6, it is possible that external terminals 124 are omitted and replaced by planar external contact areas on one side edge of the magnetic sensor package 108.

Figure 7:
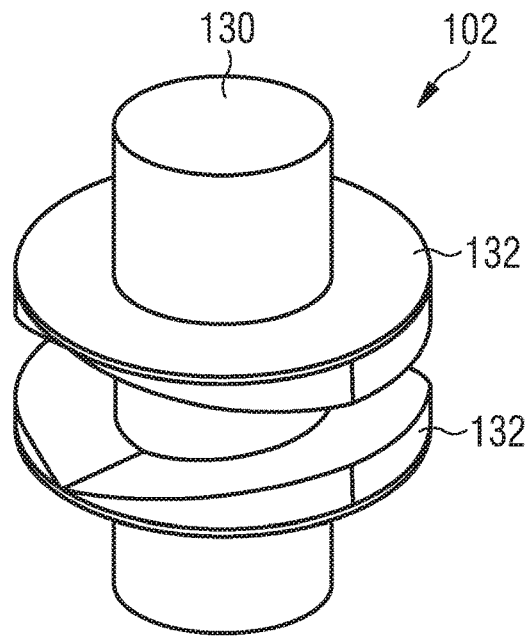
FIG. 7 illustrates a three-dimensional view of a magnetic field generating structure of a magnetic sensor arrangement according to an exemplary embodiment.

FIG. 7 illustrates a three-dimensional view of a magnetic field generating structure 102 of a magnetic sensor arrangement 100 according to an exemplary embodiment.

The three-dimensional view of the magnetic field generating structure 102 shown in FIG. 7 illustrates that the latter is composed of a for instance ferrous rotatable cylindrical shaft 130 on which, axially spaced apart, two magnetic elements 132 are rigidly mounted so as to rotate together with the shaft 130. As can furthermore be taken from FIG. 7, the thickness of both magnetic elements 132 varies along a circumference of the shaft 130, wherein a thickness at a certain angular position of one of the magnetic elements 132 corresponds to a thickness of the other of the magnetic elements 132 at this angular position. The two magnetic elements 132 are disk-shaped with circumferentially varying thickness. This allows a sensing element 114 (not shown in FIG. 7) arranged in or close to a symmetry plane of the magnetic elements 132 to detect a high magnetic field value when it is presently located close to the thickest part of the magnetic elements 132. Correspondingly, when the sensing element 114 is presently located close to the thinnest portion of the magnetic elements 132, the magnetic field goes through zero.

Between the portions of the magnetic elements 132 which are shown on the right-hand side of FIG. 7 and become thicker towards the right hand side of FIG. 7, the maximum magnetic field can be for instance +50 mT. Correspondingly, between the portions of the magnetic elements 132 which are shown on the left-hand side of FIG. 7 and become thicker towards the left hand side of FIG. 7, the maximum magnetic field can be for instance −50 mT. Between the thinnest portions of the magnetic elements 132, the magnetic field can be for instance 0 mT. The portions of the magnetic elements 132 shown on the right-hand side of FIG. 7 are magnetized in positive z-direction, whereas the portions of the magnetic elements 132 shown on the left-hand side of FIG. 7 are magnetized in negative z-direction. The rotational axis corresponds to the vertical axis according to FIG. 7.

According to FIG. 7, the circumferentially varying thickness of the magnetic element 132 provides for a circumferential modulation of the intensity of the axial magnetic field. However, an alternative configuration of the magnetic elements 132 is the provision of disk-shaped magnetic elements 132 with circumferentially homogeneous thickness but circumferentially inhomogeneous magnetization.

Figure 8:
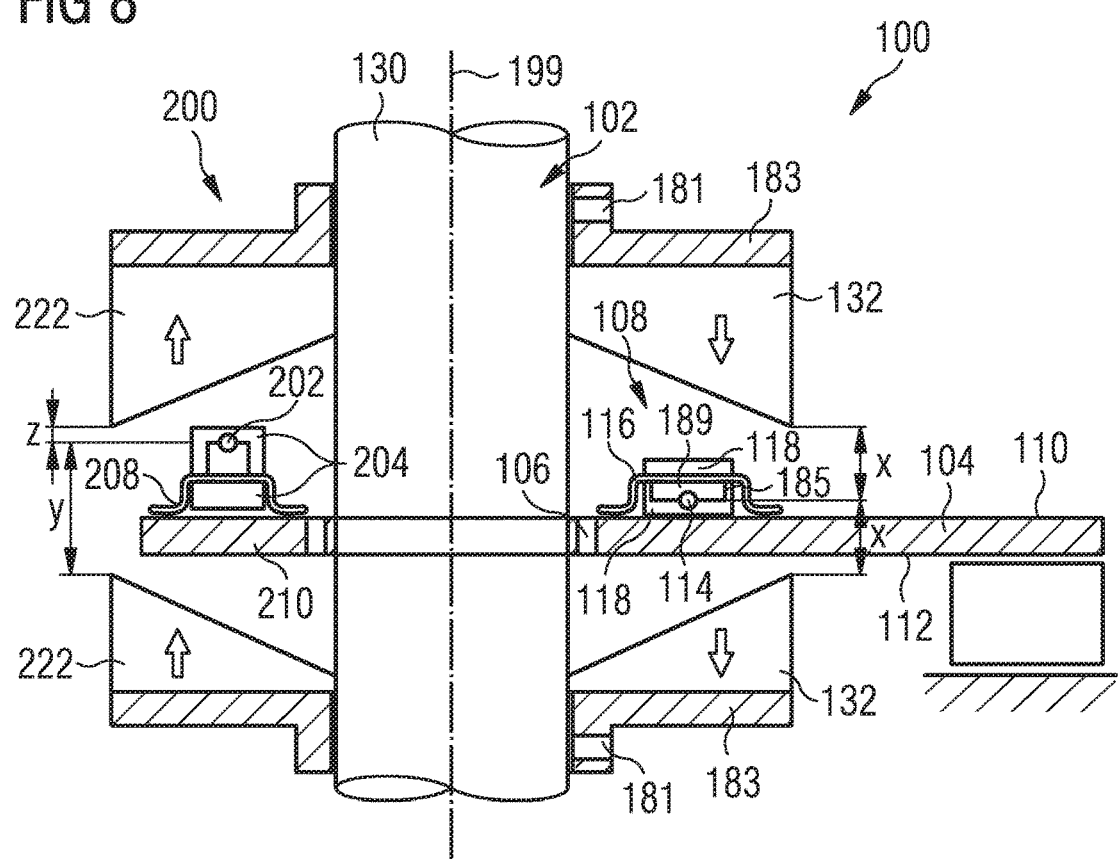
FIG. 8 illustrates a cross-sectional view of a magnetic sensor arrangement configured as angle sensor according to yet another exemplary embodiment.

FIG. 8 illustrates a cross-sectional view of a magnetic sensor arrangement 100 configured as angle sensor according to yet another exemplary embodiment.

For the sake of simplicity, FIG. 8 compares a conventional magnetic sensor arrangement 200 on the left-hand side with a magnetic sensor arrangement 100 according to an exemplary embodiment of the invention on the right-hand side.

On the left-hand side of FIG. 8, it can be seen that a sensing element 202 and an encapsulant 204 are arranged on a convex portion of a curved carrier 208, so that the sensing element 202 faces away from component board 210. This results in a large vertical thickness of the sensor portion of the magnetic sensor arrangement 220. Therefore, magnetic elements 222 need to be far away from the component board 204 which reduces the accuracy of the detection.

Next, an exemplary embodiment of the invention shown in FIG. 8 on the right-hand side will be explained. This embodiment relates to the shown magnetic sensor arrangement 100 which comprises component board 104, embodied as PCB. The component board 104 has an accommodation hole 106 for accommodating part of a magnetic field generating structure 102, i.e. part of shaft 130. The magnetic field generating structure 102 mounts the magnetic elements 132 on the shaft 130 via a holder 183 and fastening elements 181 such as screws. Moreover, a magnetic sensor package 108 is mounted on the component board 104 and is configured for sensing a magnetic field generated by the magnetic field generating structure 102. The magnetic sensor package 108 comprises sensing element 114 on carrier 116. The sensing element 114 extends from the carrier 116 towards the component board 104. Moreover, the sensing element 114 is arranged between the carrier 116 and the component board 104. According to the embodiment of FIG. 8, the carrier 116 is curved to thereby form a cavity 185 in which the sensing element 114 is at least partially accommodated.

The magnetic sensor arrangement 100 of FIG. 8 comprises an encapsulant 118, in which the sensing element 114 and the part of the carrier 116 are encapsulated, for instance a mold compound. The encapsulant 118 is arranged partly between the carrier 116 and the component board 104, and extends partly beyond the carrier 116 in an upward direction.

The carrier 116 is mounted on main surface 110 of the component board 104. The sensing element 114 may be for example located inside the magnetic sensor package 108 so as to be located closer to a mounting surface 110 of the magnetic sensor package 108 than to another magnetic sensor package surface opposing the mounting surface 110. The magnetic sensor package 108 may be located also in or close to a symmetry plane of the magnetic field generating structure 102. It may be for instance mounted on the component board 104 so that an axial spacing between the sensing element 114 and a nearest rotatable portion of the magnetic field generating structure 102 is larger than an axial spacing between the carrier 116 and the nearest rotatable portion.

According to the exemplary embodiment of the invention shown in FIG. 8 on the right-hand side, the sensing element 114 on its semiconductor chip 189 is mounted on a concave portion of the two-dimensionally curved carrier 116 and is therefore arranged in cavity 185 so that it does not add to the vertical thickness of the sensor portion of the magnetic sensor arrangement 100 according to FIG. 8. This allows the magnetic elements 132 to be spaced axially with a smaller distance, which in turn increases the detection accuracy.

Comparing the conventional arrangement on the left-hand side with the arrangement on the right-hand side according to an exemplary embodiment of the invention, the semiconductor chip (see reference numeral 189 on the right-hand side) is mounted above the carrier 208 on the left-hand side and is mounted below the carrier 116 on the right-hand side. Already for this reason, the thickness of the magnetic sensor package (see reference numeral 108 on the right-hand side) differs by the thickness of the semiconductor chip 189, i.e. around 0.2 mm.

However, even more importantly, assuming the same axial distance of the two magnetic elements 132/222, the sensing element 202 in the arrangement on the left-hand side is significantly further away from the symmetry plane of the magnetic field than on the right-hand side, where the sensing element 114 is very close to or exactly in the symmetry plane.

In a nutshell, the conventional configuration on the left-hand side of FIG. 8 may be obtained by bending legs of a lead frame away from the sensing element 202, whereas the configuration on the right-hand side of FIG. 8 according to an exemplary embodiment may be obtained by bending legs of a lead frame towards the sensing element 114.

Figure 9:
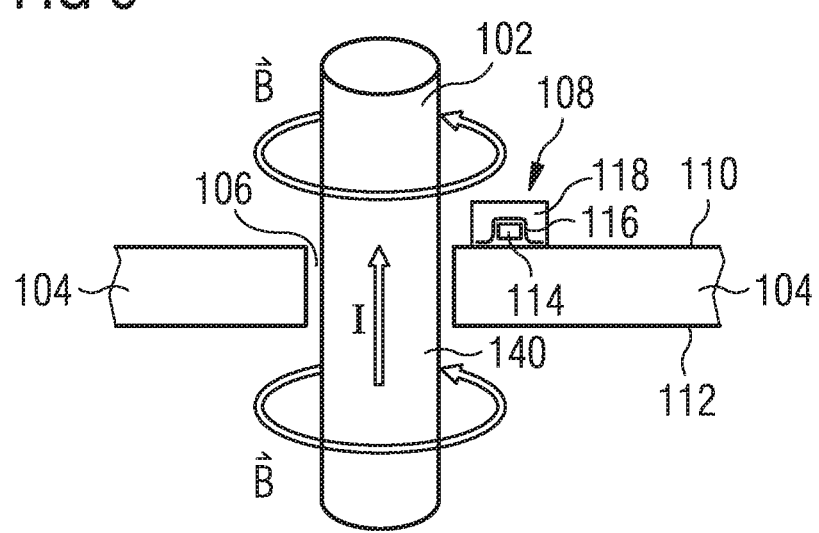
FIG. 9 illustrates a three-dimensional view of a magnetic field generating structure of a magnetic sensor arrangement configured as current sensor according to an exemplary embodiment.

FIG. 9 illustrates a three-dimensional view of a magnetic field generating structure 102 of a magnetic sensor arrangement 100 configured as current sensor according to an exemplary embodiment. According to FIG. 9, the magnetic field generating structure 102 comprises an electrically conductive structure 140 through which an electric current, which is to be sensed, can flow.

FIG. 9 shows hence a configuration in which an electric current I flows through an electrically conductive conductor as magnetic field generating structure 102. Consequently, a magnetic field B is generated in the event of a current flow. The value of this magnetic field can be sensed by the sensing element 114 of the magnetic sensor package 108.

When embedding or countersinking the magnetic sensor package 108 and the component board 104 in an appropriate way, electric breakdown from the primary conductor in form of the magnetic field generating structure 102 to the sensor circuitry may be suppressed. Hence, electric reliability of the magnetic sensor arrangement 100 may be improved.

Figure 10:
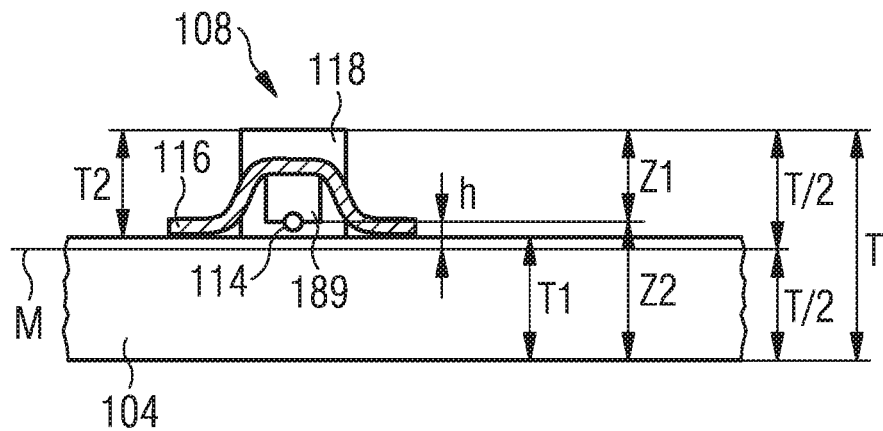
FIG. 10 to FIG. 13 illustrate cross sectional views of magnetic sensor arrangements with magnetic sensor packages according to exemplary embodiments.

FIG. 10 illustrates a cross sectional view of a magnetic sensor arrangement 100 with a magnetic sensor package 108 according to an exemplary embodiment. The magnetic sensor arrangement 100 shown in FIG. 10 comprises a component board 104 having a first vertical thickness T1. A magnetic sensor package 108 is provided with a second vertical thickness T2 and is mounted on the component board 104. A sensing element 114 of the magnetic sensor package 108 is configured for sensing a magnetic field generated by a magnetic field generating structure (not shown in FIG. 10). In the shown embodiment, the sensing element 114 is located vertically not more than one third of the sum of the first vertical thickness T1 and the second vertical thickness T2 away from a vertical center M vertically in the middle between an upper end and a lower end of the shown assembly composed of the component board 104 and the magnetic sensor package 108 mounted thereon. T denotes the entire vertical thickness of the arrangement shown in FIG. 10. Advantageously, the vertical displacement h of the sensing element 114 from the middle or vertical center M is less than one third (preferably is less than a quarter) of the sum of the individual vertical thicknesses T1 plus T2. Z1 and Z2 denote the vertical spacing of the sensing element 114 from a top end and a bottom end, respectively, of the arrangement shown in FIG. 10.

Figure 11:
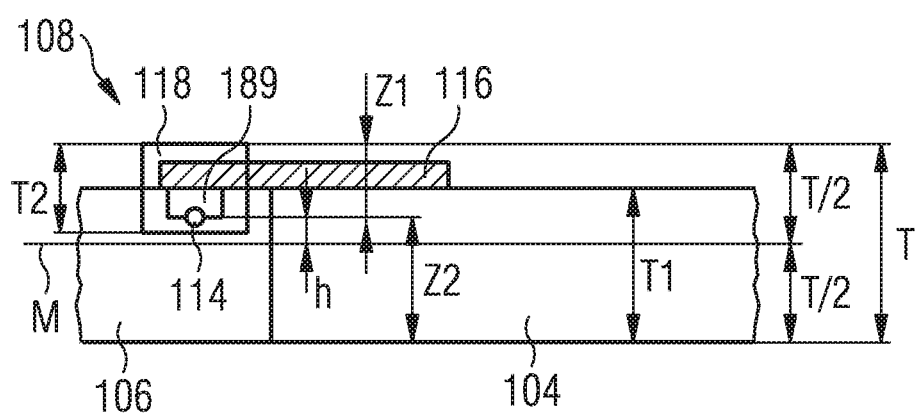

FIG. 11 illustrates a cross sectional view of a magnetic sensor arrangement 100 with a magnetic sensor package 108 according to another exemplary embodiment. Figure shows a similar situation as FIG. 10 for a leaded package.

Figure 12:
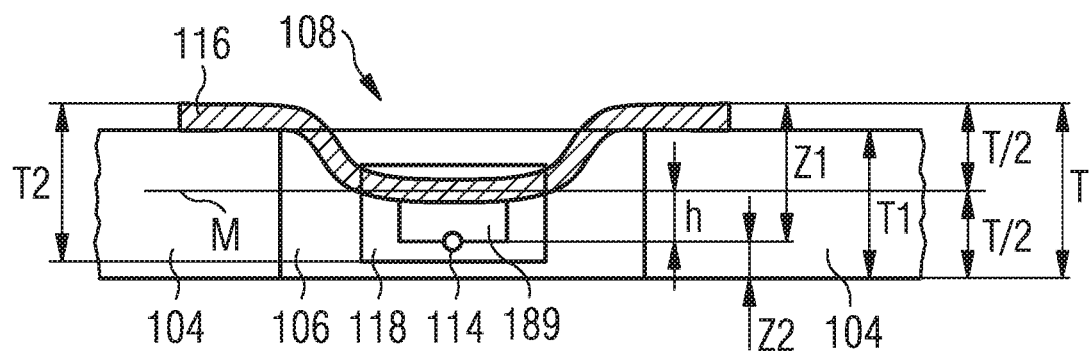

FIG. 12 illustrates a cross sectional view of a magnetic sensor arrangement 100 with a magnetic sensor package 108 according to another exemplary embodiment. FIG. 12 shows a similar situation as FIG. 10 for an SMD package.

Figure 13:
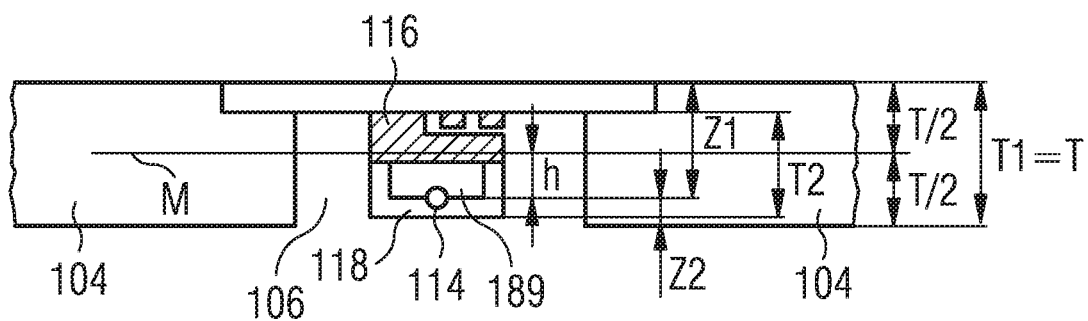

FIG. 13 illustrates a cross sectional view of a magnetic sensor arrangement 100 with a magnetic sensor package 108 according to another exemplary embodiment. Figure shows a similar situation as FIG. 10 for a leadless package.

Figure 14:
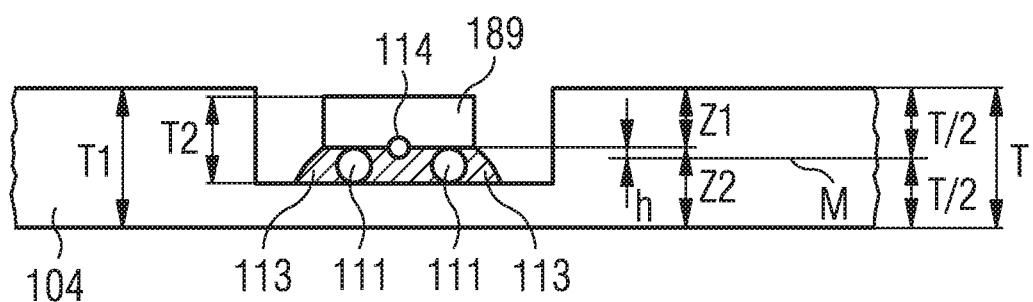
FIG. 14 and FIG. 15 illustrate cross sectional views of magnetic sensor arrangements with bare dies having a sensing element according to exemplary embodiments.

FIG. 14 illustrates a cross sectional view of a magnetic sensor arrangement 100 with a bare die in form of semiconductor chip 189 having a sensing element 114 according to an exemplary embodiment. According to the bare die architecture of FIG. 14, a bare semiconductor chip 189 rather than a package is provided. Balls or bumps for providing a connection with the component board 104 are denoted with reference numeral 111. An underfill is denoted with reference numeral 113. FIG. 14 relates to a flip chip configuration.

Figure 15:
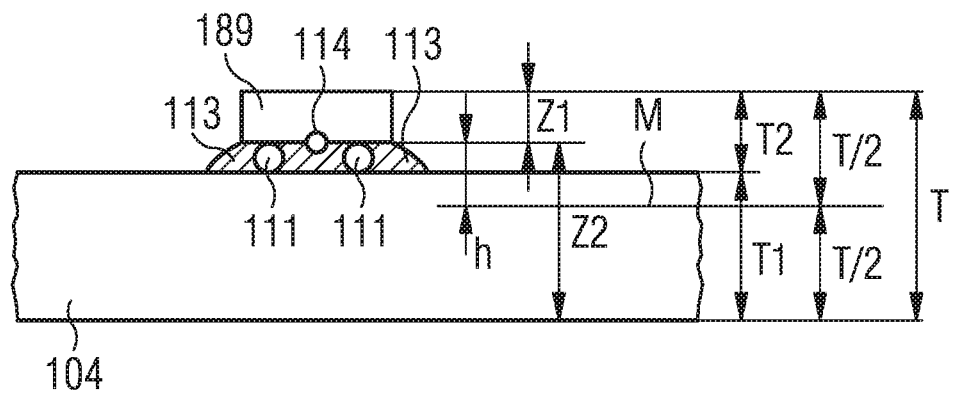

FIG. 15 illustrates a cross sectional view of a magnetic sensor arrangement 100 with a bare die in form of semiconductor chip 189 having a sensing element 114 according to another exemplary embodiment.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A magnetic sensor arrangement, comprising:
a component board having a first vertical thickness and having an accommodation hole for accommodating at least part of a magnetic field generating structure;
a magnetic sensor package or a bare semiconductor chip having a second vertical thickness, mounted on the component board, and comprising a sensing element configured for sensing a magnetic field generated by the magnetic field generating structure;
wherein the sensing element is located vertically not more than one third of the sum of the first vertical thickness and the second vertical thickness away from a vertical center vertically in the middle between an upper end and a lower end of an assembly composed of the component board and the magnetic sensor package or the bare semiconductor chip mounted thereon.

* * * * *